(12) United States Patent
Briere

(10) Patent No.: US 9,202,811 B2
(45) Date of Patent: Dec. 1, 2015

(54) CASCODE CIRCUIT INTEGRATION OF GROUP III-N AND GROUP IV DEVICES

(71) Applicant: International Rectifier Corporation, El Segundo, CA (US)

(72) Inventor: Michael A. Briere, Scottsdale, AZ (US)

(73) Assignee: Infineon Technologies Americas Corp., El Segundo, CA (US)

(*) Notice: Subject to any disclaimer, the term of this patent is extended or adjusted under 35 U.S.C. 154(b) by 0 days.

(21) Appl. No.: 14/073,783

(22) Filed: Nov. 6, 2013

(65) Prior Publication Data

US 2014/0167112 A1 Jun. 19, 2014

Related U.S. Application Data

(60) Provisional application No. 61/738,945, filed on Dec. 18, 2012.

(51) Int. Cl.
*H01L 25/10* (2006.01)
*H01L 27/088* (2006.01)
(Continued)

(52) U.S. Cl.
CPC ........ *H01L 27/0883* (2013.01); *H01L 21/8258* (2013.01); *H01L 25/105* (2013.01); *H01L 25/18* (2013.01); *H01L 2224/16225* (2013.01); *H01L 2224/32225* (2013.01); *H01L 2224/48091* (2013.01); *H01L 2224/48227* (2013.01); *H01L 2224/73204* (2013.01); *H01L 2924/13091* (2013.01)

(58) Field of Classification Search
CPC ....... H01L 25/105; H01L 25/18; H01L 25/03; H01L 27/0883; H01L 2224/16225; H01L 2224/32225; H01L 2224/48091; H01L 2224/48227; H01L 2224/73204; H01L 2924/13091; H01L 2924/00014; H01L 2924/00; H01L 21/8258
USPC ........................................... 257/194, 76, 192
See application file for complete search history.

(56) References Cited

U.S. PATENT DOCUMENTS 5,396,085 A * 3/1995 Baliga ............................. 257/77
6,624,522 B2 * 9/2003 Standing et al. .............. 257/782
(Continued)

FOREIGN PATENT DOCUMENTS

JP 2001358285 A 12/2001
JP 2011067051 A 3/2011

OTHER PUBLICATIONS

English Translation for Japanese Office Action dated Jan. 27, 2015, for Japanese Patent Application 2013-249522.
(Continued)

*Primary Examiner* — Nikolay Yushin
(74) *Attorney, Agent, or Firm* — Farjami & Farjami LLP

(57) ABSTRACT

In an exemplary implementation, an integrated assembly includes a printed circuit board, and a depletion mode III-Nitride transistor die and a group IV transistor die coupled to the printed circuit board. The depletion mode III-Nitride transistor die is situated on one side of the printed circuit board and the group IV transistor die is situated on an opposing side of the printed circuit board. At least one via in the printed circuit board electrically connects the depletion mode III-Nitride transistor die to the group IV transistor die. In some implementations, the depletion mode III-Nitride transistor die is in cascode with the group IV transistor die. Furthermore, the depletion mode III-Nitride transistor die can be situated over the group IV transistor die.

16 Claims, 10 Drawing Sheets

(51) Int. Cl.
*H01L 25/18* (2006.01)
*H01L 21/8258* (2006.01)

(56) References Cited

U.S. PATENT DOCUMENTS

| | | | | |
|---|---|---|---|---|
| 7,304,372 | B2* | 12/2007 | Hu et al. | 257/678 |
| 7,719,055 | B1* | 5/2010 | McNutt et al. | 257/341 |
| 2006/0255459 | A1 | 11/2006 | Muff | |
| 2007/0063216 | A1 | 3/2007 | Hu | |
| 2007/0210333 | A1 | 9/2007 | Lidow | |
| 2007/0259483 | A1* | 11/2007 | Lee | 438/113 |
| 2008/0191216 | A1* | 8/2008 | Machida et al. | 257/76 |
| 2011/0198611 | A1 | 8/2011 | Cheah | |
| 2011/0210338 | A1 | 9/2011 | Briere | |
| 2011/0297961 | A1* | 12/2011 | Bunin et al. | 257/76 |
| 2012/0146205 | A1* | 6/2012 | Fernando et al. | 257/677 |
| 2012/0280247 | A1* | 11/2012 | Cheah et al. | 257/76 |
| 2013/0137040 | A1 | 5/2013 | Mori | |

OTHER PUBLICATIONS

Japanese Office Action dated Jan. 20, 2015, for Japanese Patent Application 2013-249522.

* cited by examiner

CASCODE CIRCUIT INTEGRATION OF GROUP III-N AND GROUP IV DEVICES

The present application claims the benefit of and priority to U.S. Provisional Patent Application Ser. No. 61/738,945, filed on Dec. 18, 2012 and entitled "Cascode Circuit Integration of Group III-N and Group IV Devices." The disclosure of the above application is hereby incorporated fully by reference into the present application.

BACKGROUND

The following commonly assigned United States patent applications relate to and further describe other aspects of the implementations disclosed in this application and are hereby incorporated fully by reference into the present application:

U.S. patent application Ser. No. 13/018,780 "III-Nitride Power Device with Solderable Front Metal," filed on Feb. 1, 2011, and issued as U.S. Pat. No. 8,399,912;

U.S. patent application Ser. No. 09/780,080 "Vertical Conduction Flip-Chip Device with Bump Contacts on Single Surface," filed on Feb. 9, 2001, and issued as U.S. Pat. No. 6,653,740;

U.S. patent application Ser. No. 09/819,774 "Chip Scale Surface Mounted Device and Process of Manufacture," filed on Mar. 28, 2001, and issued as U.S. Pat. No. 6,624,522; and U.S. patent application Ser. No. 11/372,679 "Hybrid Semiconductor Device," filed on Mar. 10, 2006, and issued as U.S. Pat. No. 8,017,978.

I. Definitions

As used herein, the phrase "group III-V" refers to a compound semiconductor including at least one group III element and at least one group V element. By way of example, a group III-V semiconductor may take the form of a III-Nitride semiconductor. "III-Nitride", or "III-N", refers to a compound semiconductor that includes nitrogen and at least one group III element such as aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), for example. III-Nitride also refers generally to any polarity including but not limited to Ga-polar, N-polar, semi-polar, or non-polar crystal orientations. A III-Nitride material may also include either the Wurtzitic, Zincblende, or mixed polytypes, and may include single-crystal, monocrystalline, polycrystalline, or amorphous structures. Gallium nitride or GaN, as used herein, refers to a III-Nitride compound semiconductor wherein the group III element or elements include some or a substantial amount of gallium, but may also include other group III elements in addition to gallium. A group III-V or a GaN transistor may also refer to a composite high voltage enhancement mode transistor that is formed by connecting the group III-V or the GaN transistor in cascode with a lower voltage group IV transistor.

Also, as used herein, the terms "LV-device," "low voltage semiconductor device," "low voltage transistor," and the like, refer to a low voltage device, with a typical voltage range of up to approximately 50 volts. Typical voltage ratings include low voltage (LV) approximately 0V to 50V, midvoltage (MV) approximately 50V to 200V, high voltage (HV) approximately 200V to 1200V, and ultra high voltage (UHV) greater than approximately 1200V. The LV-device can comprise any suitable group IV semiconductor materials. As used herein, the phrase "group IV" refers to a semiconductor that includes at least one group IV element, including silicon (Si), germanium (Ge), and carbon (C), and also includes compound semiconductors such as SiGe and SiC, for example. Group IV may also refer to a semiconductor material which consists of layers of group IV elements or doping of group IV elements to produce strained silicon or other strained group IV material. In addition, group IV based composite substrates may include semiconductor on insulstor (SOI), separation by implantation of oxygen (SIMOX) process substrates, and silicon on sapphire (SOS), for example. Moreover, a group IV device may include devices formed using standard CMOS processing, but may also include NMOS and PMOS device processing.

II. Background Art

III-Nitride materials are semiconductor compounds that have a relatively wide, direct bandgap and potentially strong piezoelectric polarizations, and can enable high breakdown fields, high saturation velocities, and the creation of two-dimensional electron gases (2 DEGs). As a result, III-Nitride materials are used in many power applications such as depletion mode (e.g., normally ON) III-Nitride transistors (e.g. high-electron-mobility transistors), and diodes.

In certain applications, it may be desirable to couple a depletion mode III-Nitride transistor to a group IV transistor (e.g. a silicon transistor). For example, in power management applications where normally OFF characteristics of power devices are generally desirable, a depletion mode III-Nitride transistor can be in cascode with a group IV transistor to produce an enhancement mode composite device. Moreover, the depletion mode III-Nitride transistor and the group IV transistor need be efficiently packaged or assembled to meet cost, performance, size, and throughput requirements.

SUMMARY

The present invention is directed to cascode circuit integration of group III-N and group IV devices, substantially as shown in and/or described in connection with at least one of the figures, and as set forth more completely in the claims.

DETAILED DESCRIPTION

Figure 1A:
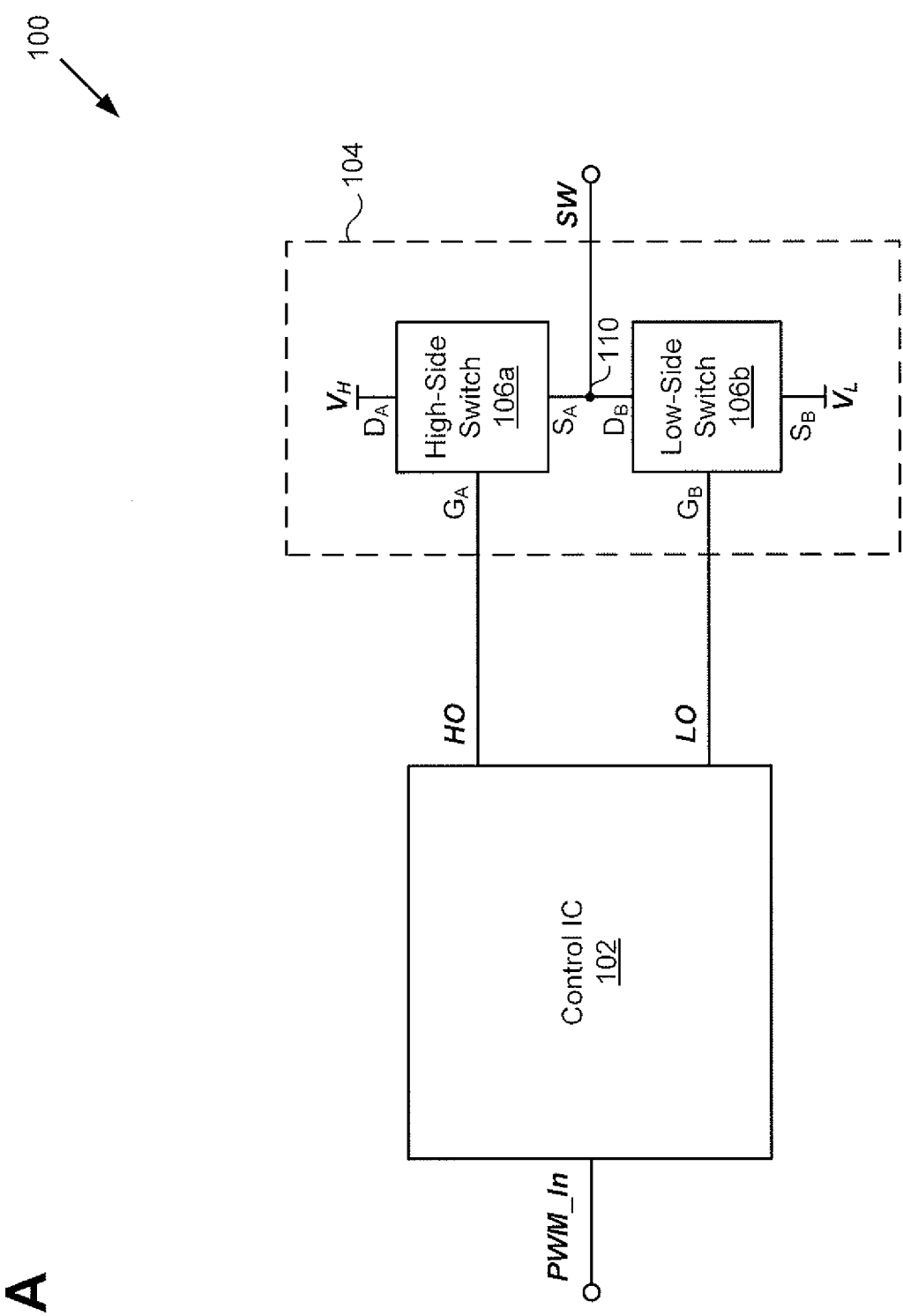
FIG. 1A shows a circuit schematic of an exemplary power conversion circuit, in accordance with one implementation of the present disclosure.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1A shows a circuit schematic of an exemplary power conversion circuit, in accordance with one implementation of the present disclosure. As shown in FIG. 1, power conversion circuit 100 includes control integrated circuit (IC) 102 and power switching stage 104. Power switching stage 104 includes at least one switch, such as high-side switch 106a and low-side switch 106b. In power switching stage 104, high-side switch 106a and low-side switch 106b are connected between high-side voltage $V_H$ and low-side voltage $V_L$ and output node 110 is between high-side switch 106a and low-side switch 106b.

Power conversion circuit 100 has pulse width modulated (PWM) input signal PWM_In and switching voltage SW as an output. Control IC 102 receives PWM input signal PWM_In and optionally switching voltage SW and provides high-side drive signal HO and low-side drive signal LO, which are gate drive signals, as outputs. Control IC 102 may also be referred to as a driver IC or gate driver IC. Power switching stage 104 receives high-side drive signal HO and low-side drive signal LO as inputs and outputs switching voltage SW.

Control IC 102 is configured to generate high-side drive signal HO and low-side drive signal LO based on PWM input signal PWM_In and optionally switching voltage SW to drive respective high-side and low-side switches 106a and 106b of power switching stage 104 using synchronous rectification.

Power switching stage 104 is shown as a half-bridge coupled between high-side voltage $V_H$ and low-side voltage $V_L$, by way of example. High-side switch 106a has drain $D_A$ connected to high-side voltage $V_H$ and source $S_A$ connected to output node 110 where gate $G_A$ of high-side switch 106a is configured to receive high-side drive signal HO. Similarly, low-side switch 106b has drain $D_B$ connected to output node 110 and source $S_B$ connected to low-side voltage $V_L$ where gate $G_B$ of low-side switch 106b is configured to receive low-side drive signal LO.

In power conversion circuit 100, high-side switch 106a and low-side switch 106b (also referred to as power switches 106a and 106b) each include a depletion mode (e.g., normally ON) III-Nitride transistor, and more particularly a high-electron-mobility transistor (HEMT). By including at least one depletion mode III-Nitride transistor in power switching stage 104, power conversion circuit 100 may exploit the high breakdown fields, high saturation velocities, and two-dimensional electron gases (2 DEGs) offered by III-Nitride materials.

It may be desirable to couple the at least one depletion mode III-Nitride transistor to a group IV transistor (e.g. a silicon transistor). For example, it may be desirable for the at least one depletion mode III-Nitride transistor to operate as an enhancement mode device in power conversion circuit 100. This may be accomplished by coupling the at least one depletion mode III-Nitride transistor in cascode with a group IV transistor to produce an enhancement mode composite device, such as enhancement mode composite device 106 in FIG. 1B.

Figure 1B:
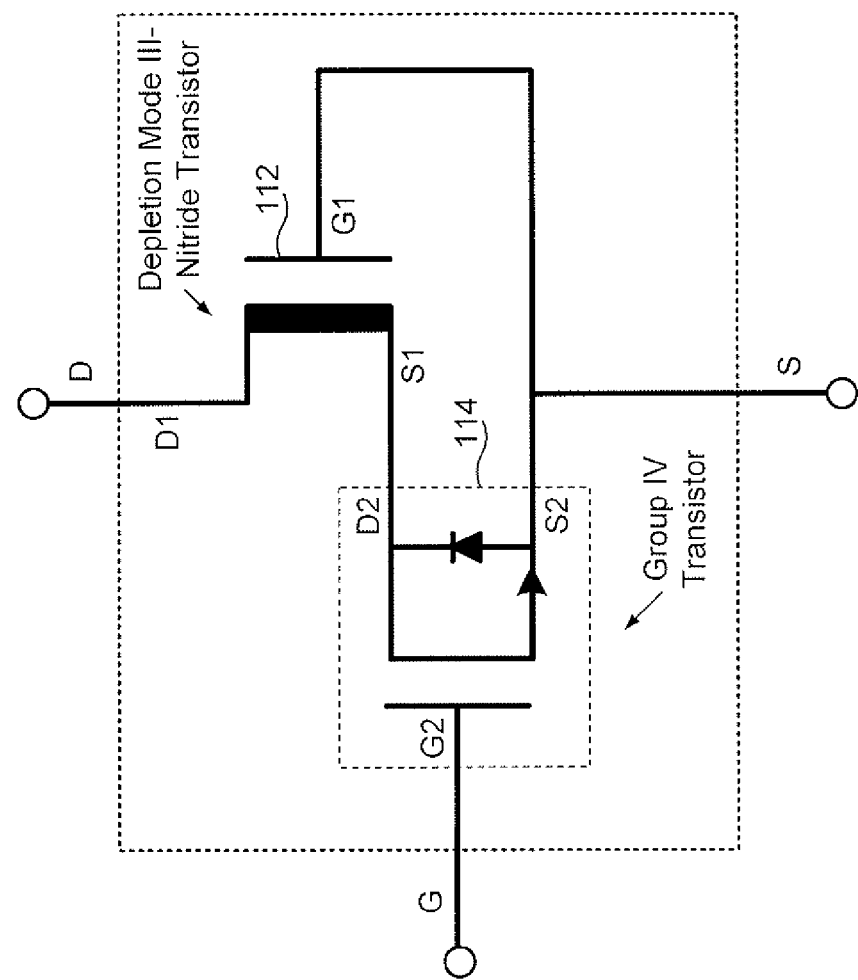
FIG. 1B presents an exemplary circuit schematic of a depletion mode III-Nitride transistor coupled to a group IV transistor, in accordance with one implementation of the present disclosure.

Referring now to FIG. 1B, FIG. 1B presents an exemplary circuit schematic of a depletion mode III-Nitride transistor coupled to a group IV transistor, in accordance with one implementation of the present disclosure. Enhancement mode composite device 106 includes composite gate G, composite source S, and composite drain D. Enhancement mode composite device 106 can correspond to at least one of high-side and low-side switches 106a and 106b in FIG. 1A. More particularly, one of enhancement mode composite device 106 may be utilized as high-side switch 106a and another of enhancement mode composite device 106 may be utilized as low-side switch 106b in power conversion circuit 100. Thus, composite gate G, composite source S, and composite drain D of enhancement mode composite device 106 may correspond respectively to gate $G_A$, source $S_A$, and drain $D_A$ of high-side power switch 106a. Furthermore, composite gate G, composite source S, and composite drain D of enhancement mode composite device 106 may correspond respectively to gate $G_B$, source $S_B$, and drain $D_B$ of low-side switch 106b.

Enhancement mode composite device 106 includes depletion mode III-Nitride transistor 112 in cascode with group IV transistor 114. Group IV transistor 114 can be a silicon based power switching device, such as a power metal-oxide-semiconductor field-effect transistor (MOSFET). In the present implementation, group IV transistor 114 is an enhancement mode transistor and more particularly is an enhancement mode silicon transistor. As shown, group IV transistor 114 includes a diode, which may be formed as a body diode or otherwise on a common die with group IV transistor 114. Depletion mode III-Nitride transistor 112 can be a III-Nitride heterojunction field-effect transistor (HFET), and more specifically a III-Nitride HEMT, such as a GaN HEMT.

In enhancement mode composite device 106, drain D2 of group IV transistor 114 is connected to source S1 of depletion mode III-Nitride transistor 112, such that both devices will be in blocking mode under a reverse voltage condition. As configured, group IV transistor 114 can be an LV-device while depletion mode III-Nitride transistor 112 can be an HV-device or an MV-device. A similar device is disclosed in a related U.S. patent application entitled "Hybrid Semiconductor Device" Ser. No. 11/372,679 filed Mar. 10, 2006, issued as U.S. Pat. No. 8,017,978, and assigned to the assignee of the present application. Furthermore, in enhancement mode composite device 106, gate G1 of depletion mode III-Nitride transistor 112 is connected to source S2 of group IV transistor 114. Thus, depletion mode III-Nitride transistor 112 may be off absent a bias voltage on gate G2 of group IV transistor 114, such that enhancement mode composite device 106 is a normally OFF device.

Depletion mode III-Nitride transistor 112 and group IV transistor 114 may be coupled together and housed in a common package that may be coupled to a printed circuit board (PCB). However, the common package would increase parasitic inductance and thermal impedance of enhancement mode composite device 106. These device characteristics are of particular importance in high frequency, high current applications, such as where depletion mode III-Nitride transistor 112 and group IV transistor 114 form a power switch. Furthermore, assembly of depletion mode III-Nitride transistor 112 and group IV transistor 114 in the common package and assembly of the common package on a PCB can be costly.

In accordance with various implementations of the present disclosure, depletion mode III-Nitride transistor 112 is on a depletion mode III-Nitride transistor die situated on a PCB and group IV transistor 114 is on a group IV transistor die situated on the PCB. Thus, a depletion mode III-Nitride transistor can be coupled to a group IV transistor while avoiding increased parasitic inductance, thermal impedance, and assembly cost, while forming a high performance composite device, such as enhancement mode composite device 106.

Figure 2A:
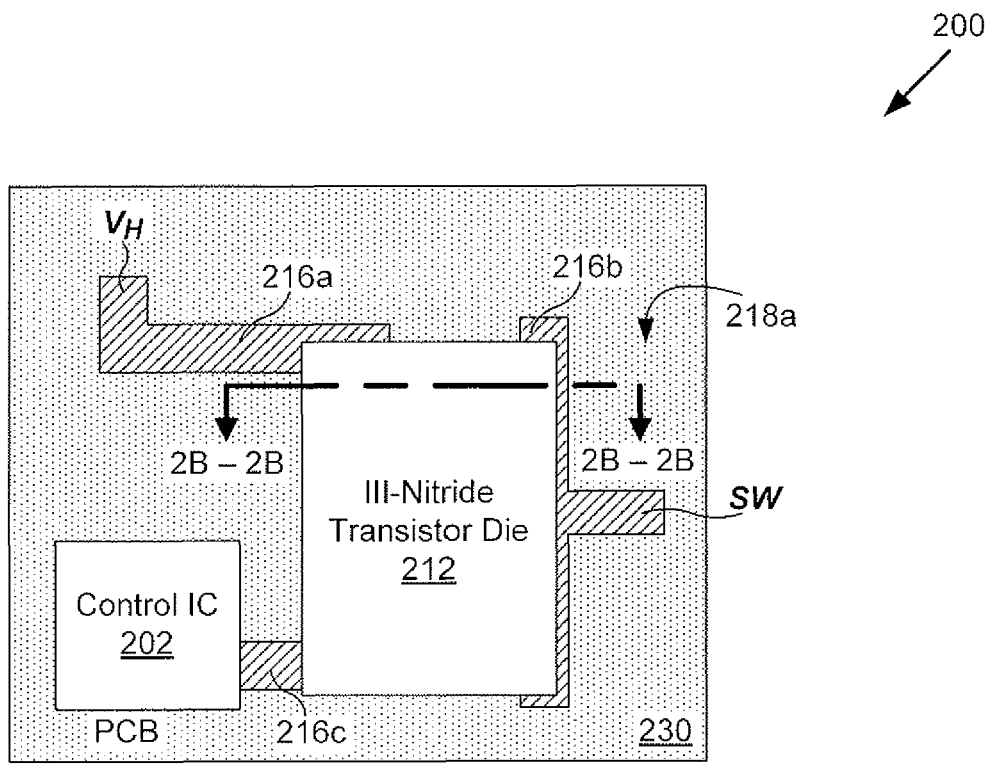
FIG. 2A presents a top view of a portion of an exemplary integrated assembly, in accordance with one implementation of the present disclosure.
Figure 2B:
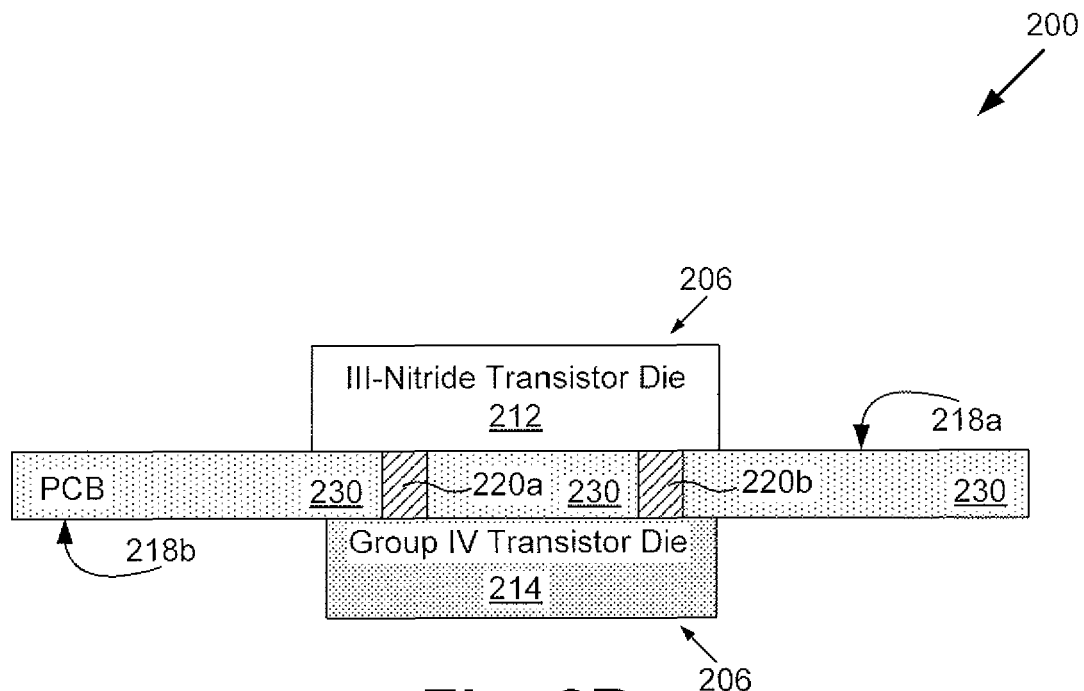
FIG. 2B presents a cross-sectional view of a portion of an exemplary integrated assembly, in accordance with one implementation of the present disclosure.

Referring now to FIGS. 2A and 2B, FIG. 2A presents a top view of a portion of an exemplary integrated assembly, in accordance with one implementation of the present disclosure. FIG. 2B presents a cross-sectional view of a portion of the exemplary integrated assembly, in accordance with one implementation of the present disclosure. The cross-sectional view presented in FIG. 2B corresponds to cross-section 2B-2B in FIG. 2A. Power conversion circuit 100 of FIG. 1A can be formed in integrated assembly 200 of FIGS. 2A and 2B.

Integrated assembly 200 includes control IC 202 and enhancement mode composite device 206 corresponding respectively to control IC 102 and enhancement mode composite device 106 in FIGS. 1A and 1B. Although only enhancement mode composite device 206 is shown, integrated assembly 200 can include more than one enhancement mode composite device, which can be similar to or different than enhancement mode composite device 206, so as to form power conversion circuit 100.

Enhancement mode composite device 206 includes depletion mode III-Nitride transistor die 212 and group IV transistor die 214 corresponding respectively to depletion mode III-Nitride transistor 112 and group IV transistor 114 in FIG. 1B. Depletion mode III-Nitride transistor die 212 and group IV transistor die 214 can each be discrete devices and are coupled to PCB 230. Depletion mode III-Nitride transistor die 212 is situated on side 218a of PCB 230 and group IV transistor die 214 is situated on side 218b of PCB 230, which is opposing side 218a. In doing so, the overall footprint of enhancement mode composite device 206 can be reduced, for example, by allowing for depletion mode III-Nitride transistor die 212 to be situated over group IV transistor die 214, as shown.

PCB 230 includes at least one via, such as vias 220a and 220b, which extend through PCB 230. PCB 230 can further include various additional components, such one or more inductor, capacitor, resistor, and/or other enhancement mode composite devices on or embedded therein. For example, one or more output capacitor and/or output inductor of power conversion circuit 100 can be on or in PCB 230. Any of the additional components may be electrically connected to enhancement mode composite device 206 through conductive traces of PCB 230. Also, although only vias 220a and 220b are shown, PCB 230 can include various other structures therein, such as different levels of conductive traces, which may be connected by vias.

At least one via, such as vias 220a and 220b in PCB 230 are electrically connecting depletion mode III-Nitride transistor die 212 to group IV transistor die 214. As shown, vias 220a and 220b optionally extend completely through PCB 230. Vias 220a and 220b include conductive material, such as copper. Vias 220a and 220b are situated between depletion mode III-Nitride transistor die 212 and group IV transistor die 214. In doing so, a short connection can be made through PCB 230 that has low parasitic inductance and resistance. As one specific example, via 220b may be connecting source S1 (shown in FIG. 1B) of depletion mode III-Nitride transistor die 212 to drain D2 (shown in FIG. 1B) of group IV transistor die 214. Furthermore, via 220a may be connecting gate G1 (shown in FIG. 1B) of depletion mode III-Nitride transistor die 212 to source S1 of group IV transistor die 214 (shown in FIG. 1B). Other vias may be electrically connecting depletion mode III-Nitride transistor die 212, group IV transistor die 214, and/or control IC 202, or may be utilized for electrical routing of any of the nodes or terminals of power conversion circuit 100 between sides 218a and 218b of PCB 230.

Thus, depletion mode III-Nitride transistor die 212 is coupled to group IV transistor die 214 while avoiding increased parasitic inductance, thermal impedance, and assembly cost, which can be incurred when coupling a depletion mode III-Nitride transistor and group IV transistor in a common package to a PCB. Furthermore, a circuit that includes the depletion mode III-Nitride transistor and the group IV transistor can be formed on the PCB. In the implementations shown, the circuit is power conversion circuit 100 formed on PCB 230, which includes depletion mode III-Nitride transistor die 212 and group IV transistor die 214 coupled to PCB 230. More particularly, depletion mode III-Nitride transistor die 212 is connected in cascode with group IV transistor die 214 utilizing PCB 230 so as to provide a high performance power switch in power conversion circuit 100.

As shown in FIGS. 2A and 2B, enhancement mode composite device 206 corresponds to high-side switch 106a in FIG. 1A, by way of example. Thus, high-side voltage $V_H$ (i.e. input voltage $V_H$), switching voltage SW (i.e. output voltage SW), and high-side drive signal HO (i.e. gate drive signal HO) are shown as being on respective traces 216a, 216b, and 216c on PCB 230. Traces 216a, 216b, and 216c include conductive material, such as copper. Traces in various implementations disclosed herein can be on a top or bottom surface of a PCB and/or embedded within the PCB. It is noted that while control IC 202 is shown as being situated on side 218a of PCB 230, control IC 202 can instead be situated on side 218b of PCB 230. Furthermore, PCB 230 can include various other traces and/or vias so as to form power conversion circuit 100 of FIG. 1A.

FIGS. 3A, 3B, 3C, 3D, 3E, 3F, and 3G present cross-sectional views of portions of exemplary integrated assemblies, in accordance with various implementations of the present disclosure. FIGS. 3A, 3B, 3C, 3D, 3E, 3F, and 3G show integrated assemblies 300a, 300b, 300c, 300d, 300e, 300f, and 300g, corresponding to integrated assembly 200 in FIGS. 2A and 2B. In FIGS. 3A, 3B, 3C, 3D, 3E, 3F, and 3G, sides 318a and 318b, depletion mode III-Nitride transistor die 312, group IV transistor die 314, PCB 330, and vias 320a and 320b correspond respectively to sides 218a and 218b, depletion mode III-Nitride transistor die 212, group IV transistor die 214, PCB 230, and vias 220a and 220b in FIGS. 2A and 2B.

Figure 3A:
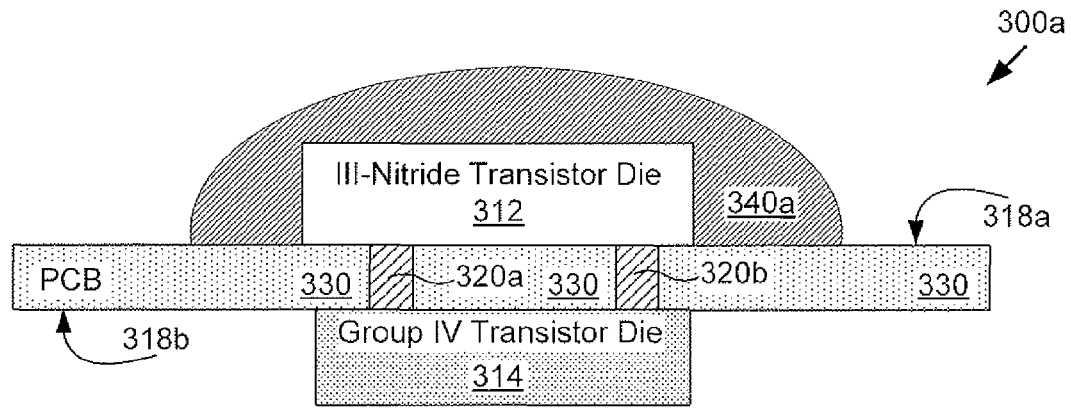
FIG. 3A presents a cross-sectional view of a portion of an exemplary integrated assembly, in accordance with one implementation of the present disclosure.
Figure 3B:
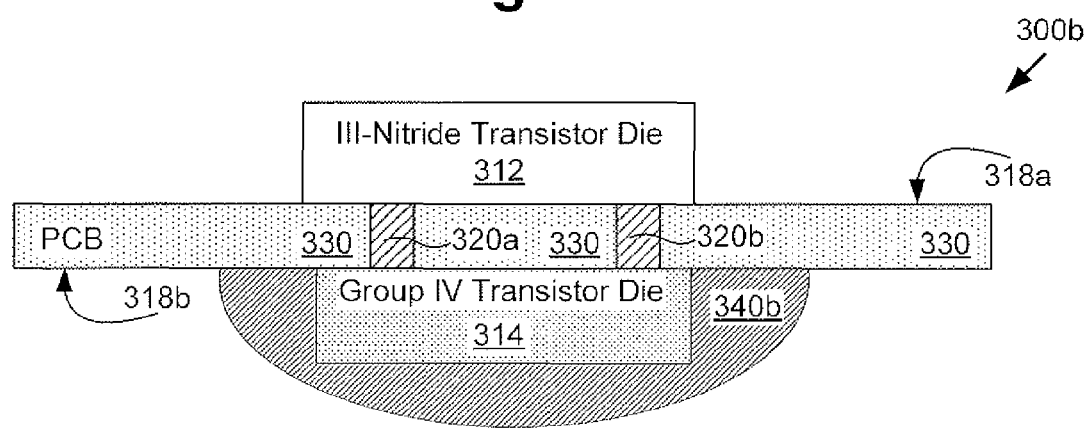
FIG. 3B presents a cross-sectional view of a portion of an exemplary integrated assembly, in accordance with one implementation of the present disclosure.
Figure 3C:
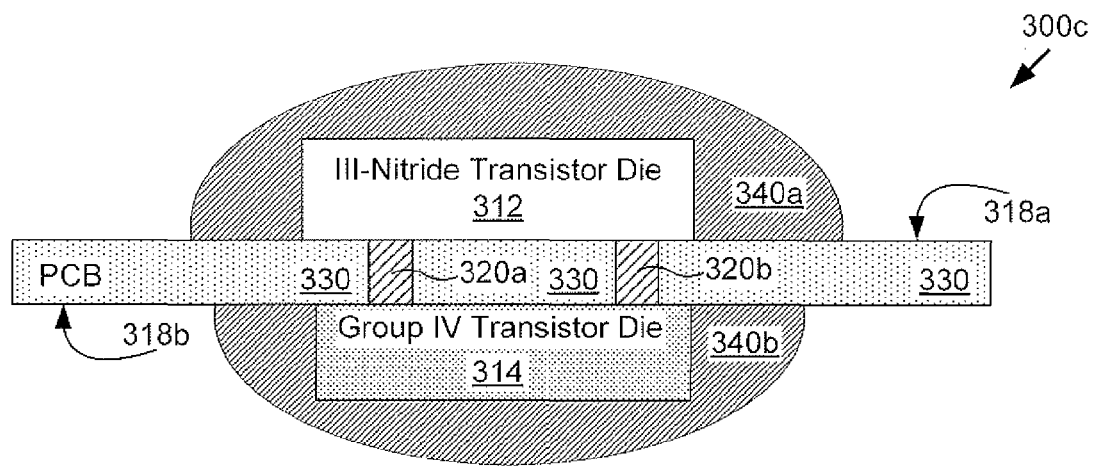
FIG. 3C presents a cross-sectional view of a portion of an exemplary integrated assembly, in accordance with one implementation of the present disclosure.

FIGS. 3A, 3B, and 3C show that at least one of group IV transistor die 314 and depletion mode III-Nitride transistor die 312 can be encapsulated on PCB 330. In FIG. 3A, at least depletion mode III-Nitride transistor die 312 is encapsulated on side 318a of PCB 330. Integrated assembly 300a includes encapsulant 340a, which is utilized to encapsulate at least depletion mode III-Nitride transistor die 312 on PCB 330. An example of encapsulant 340a is a glop top encapsulant, such as various resins including epoxy resins. Encapsulant 340a can protect depletion mode III-Nitride transistor die 312 from moisture, chemicals, and contaminants. Furthermore, encapsulant 340a can compensate for thermal mismatch between depletion mode III-Nitride transistor die 312 and PCB 330 while providing mechanical support and electrical insulation.

In FIG. 3B, at least group IV transistor die 314 is encapsulated on PCB 330. Integrated assembly 300b includes encapsulant 340b, which is utilized to at least encapsulate group IV transistor die 314 on side 318b of PCB 330. An example of encapsulant 340b is a glop top encapsulant, such as a epoxy. Encapsulant 340b can protect group IV transistor die 314 from moisture, chemicals, and contaminants. Furthermore, encapsulant 340b can compensate for thermal mismatch between group IV transistor die 314 and PCB 330 while providing mechanical support and electrical insulation.

Figure 3D:
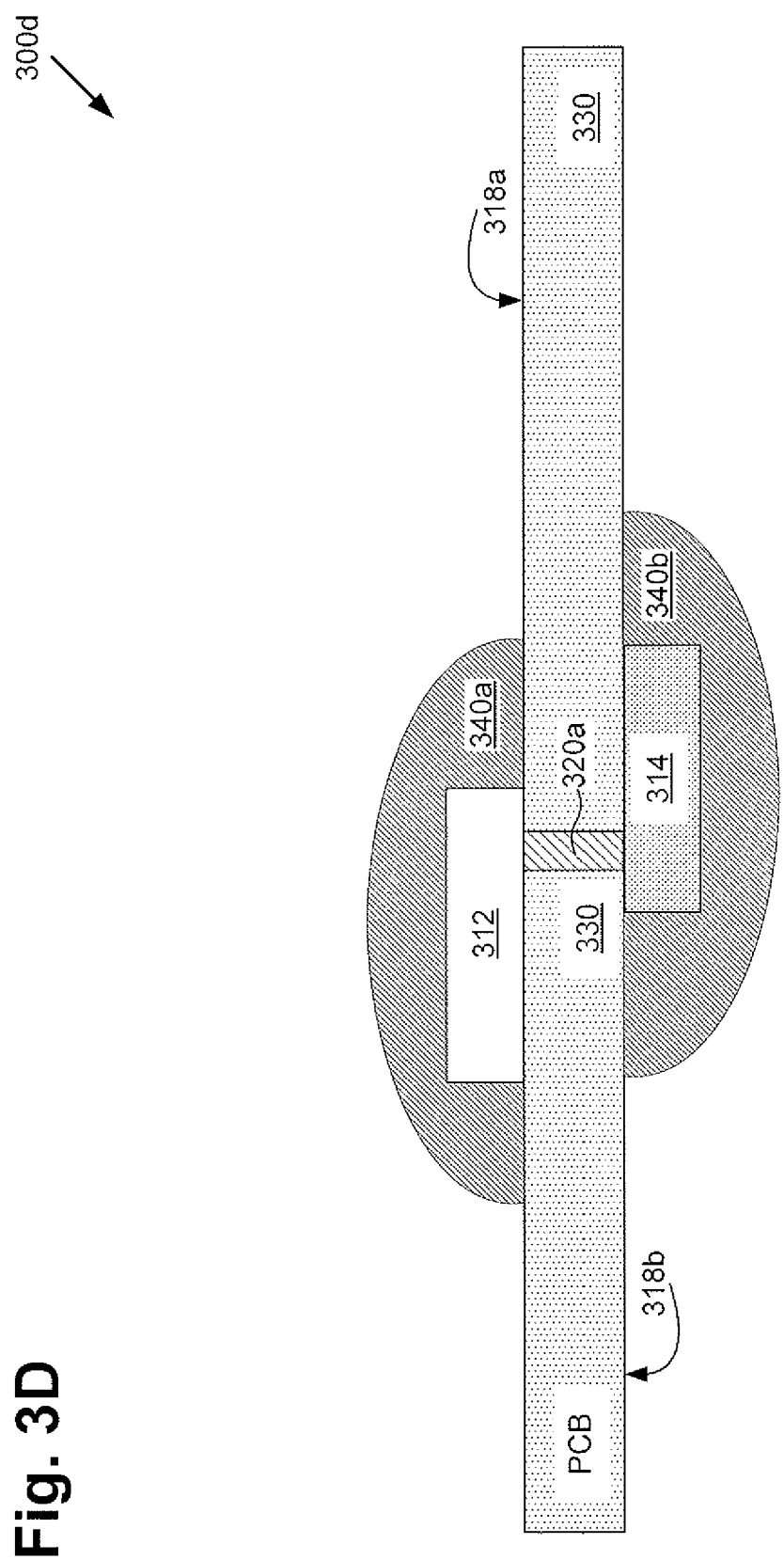
FIG. 3D presents a cross-sectional view of a portion of an exemplary integrated assembly, in accordance with one implementation of the present disclosure.

In FIG. 3C, at least group IV transistor die 314 and depletion mode III-Nitride transistor die 312 are encapsulated on PCB 330. Integrated assembly 300c includes encapsulant 340a, which is utilized to encapsulate at least depletion mode III-Nitride transistor die 312 on side 318a of PCB 330, and encapsulant 340b, which is utilized to at least encapsulate group IV transistor die 314 on side 318b of PCB 330. Encapsulant 340b may include the same or different material than encapsulant 340a. Utilizing different materials for encapsulant 340a and encapsulant 340b can be advantageous where group IV transistor die 314 and depletion mode III-Nitride transistor die 312 include different semiconductor materials with different thermal profiles (e.g. silicon and GaN respectively). FIGS. 3A, 3B, and 3C show implementations in which group IV transistor die 314 is directly under and not offset from depletion mode III-Nitride transistor die 312. However, FIG. 3D shows that group IV transistor die 314 can be directly under, but offset from depletion mode III-Nitride transistor die 312. Thus, there is an overlap between group IV transistor die 314 and depletion mode III-Nitride transistor die 312. In contrast, FIGS. 3E, 3F, and 3G show implementations where group IV transistor die 314 is not directly under and is offset from depletion mode III-Nitride transistor die 312 without overlapping depletion mode III-Nitride transistor die 312.

Figure 3E:
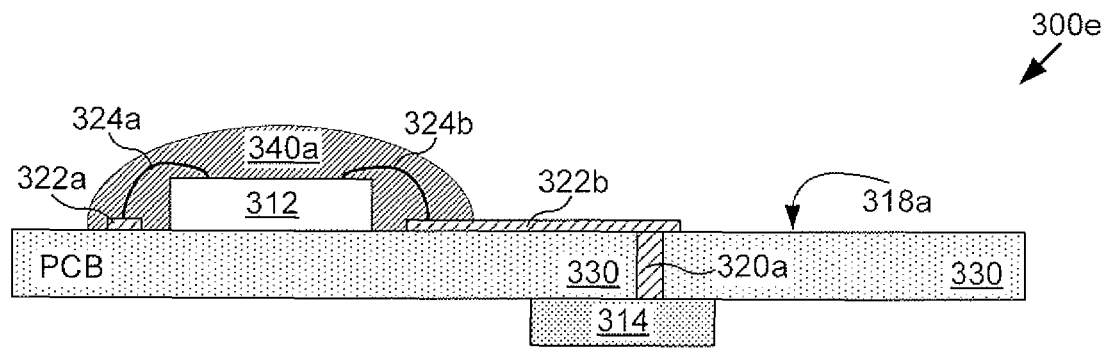
FIG. 3E presents a cross-sectional view of a portion of an exemplary integrated assembly, in accordance with one implementation of the present disclosure.
Figure 3F:
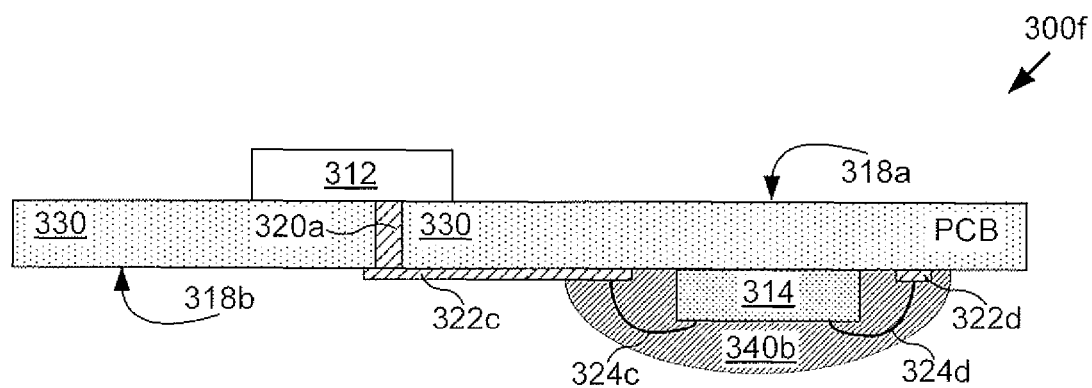
FIG. 3F presents a cross-sectional view of a portion of an exemplary integrated assembly, in accordance with one implementation of the present disclosure.
Figure 3G:
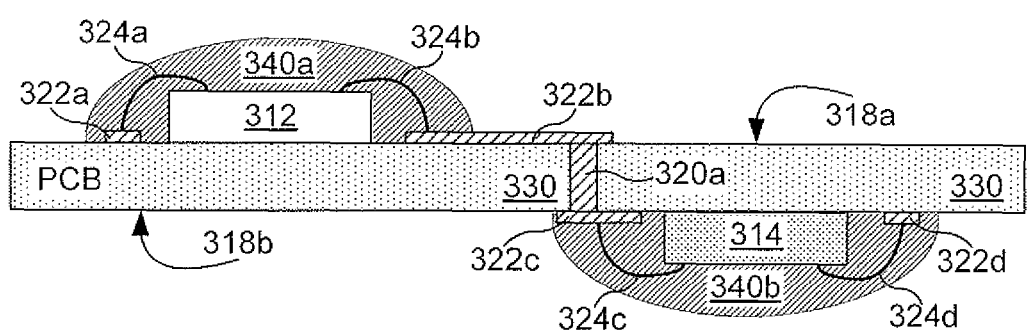
FIG. 3G presents a cross-sectional view of a portion of an exemplary integrated assembly, in accordance with one implementation of the present disclosure.

Also shown in FIGS. 3E, 3F, and 3G, at least one bondwire can be utilized to couple depletion mode III-Nitride transistor die 312 to group IV transistor die 314. The at least one bondwire can optionally be encapsulated as shown. Referring to FIG. 3E, integrated assembly 300e includes at least one bondwire, such as bondwires 324a and 324b electrically connecting depletion mode III-Nitride transistor die 312 to PCB 330. More particularly, bondwire 324a is electrically connecting depletion mode III-Nitride transistor die 312 to trace 322a on PCB 330. Also, bondwire 324b is electrically connecting depletion mode III-Nitride transistor die 312 to trace 322b on PCB 330, which may be electrically connected to via 320a, as shown.

Referring to FIG. 3F, integrated assembly 300f includes at least one bondwire, such as bondwires 324c and 324d electrically connecting group IV transistor die 314 to PCB 330. More particularly, bondwire 324d is electrically connecting group IV transistor die 314 to trace 322d on PCB 330. Also, bondwire 324c is electrically connecting group IV transistor die 314 to trace 322c on PCB 330, which may be electrically connected to via 320a, as shown.

Referring to FIG. 3G, integrated assembly 300g includes at least one bondwire, such as bondwires 324c and 324d electrically connecting group IV transistor die 314 to PCB 330. Integrated assembly 300g also includes at least one bondwire, such as bondwires 324a and 324b electrically connecting depletion mode III-Nitride transistor die 312 to PCB 330. Bondwire 324a is electrically connecting depletion mode III-Nitride transistor die 312 to trace 322a on PCB 330. Also, bondwire 324b is electrically connecting depletion mode III-Nitride transistor die 312 to trace 322b on PCB 330, which may be electrically connected to via 320a, as shown. Bondwire 324d is electrically connecting group IV transistor die 314 to trace 322d on PCB 330. Also, bondwire 324c is electrically connecting group IV transistor die 314 to trace 322c on PCB 330, which may be electrically connected to via 320a, as shown.

Thus, in some implementations, at least one bondwire can be utilized to couple depletion mode III-Nitride transistor die 312 to group IV transistor die 314. It should therefore be appreciated that any of source S1, drain D1, and gate G1 of FIG. 1B can be provided on either the top or bottom sides of depletion mode III-Nitride transistor die 312. Furthermore, any of source S2, drain D2, and gate G2 of FIG. 1B can be provided on either the top or bottom sides of group IV transistor die 314. Furthermore, any of composite source S, composite drain D, and composite gate G of FIG. 1B can be provided on either side 318a or 318b of PCB 330.

Figure 4:
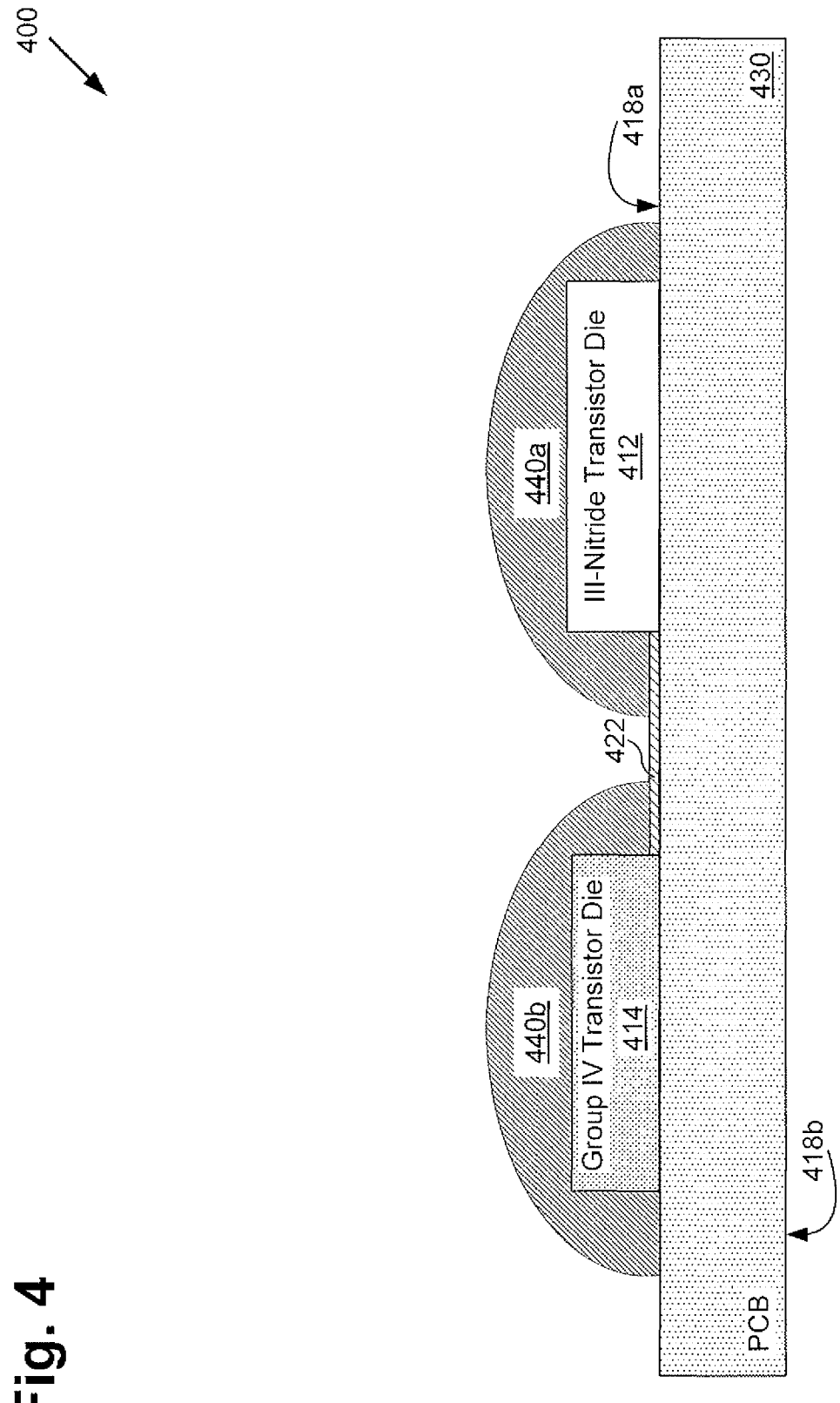
FIG. 4 presents a cross-sectional view of a portion of an exemplary integrated assembly, in accordance with one implementation of the present disclosure.

Referring now to FIG. 4, FIG. 4 presents a cross-sectional view of a portion of an exemplary integrated assembly, in accordance with one implementation of the present disclosure. In FIG. 4, integrated assembly 400 corresponds to integrated assembly 200 in FIGS. 2A and 2B. Thus, power conversion circuit 100 can be formed in integrated assembly 400, including control IC 102. Integrated assembly 400 includes sides 418a, 418b, depletion mode III-Nitride transistor die 412, group IV transistor die 414, and PCB 430 corresponding to sides 218a, 218b, depletion mode III-Nitride transistor die 212, group IV transistor die 214, and PCB 230 in FIGS. 2A and 2B.

In integrated assembly 400, depletion mode III-Nitride transistor die 412 and group IV transistor die 414 are coupled to PCB 430. Furthermore, depletion mode III-Nitride transistor die 412 and group IV transistor die 414 are situated on a same side of PCB 430. The same side is shown as side 418a, but may instead be side 418b. At least one trace, such as trace 422, in PCB 430 is electrically connecting depletion mode III-Nitride transistor die 412 to group IV transistor die 414. As with other traces described herein, trace 422 includes conductive material, such as copper. As depletion mode III-Nitride transistor die 412 and group IV transistor die 414 are situated side-by-side on PCB 430, trace 422 and any other traces, conductive clips, bondwires, and/or other connection means coupling depletion mode III-Nitride transistor die 412 and group IV transistor die 414 can be small with low parasitic inductance and resistance.

Depletion mode III-Nitride transistor die 412 and/or group IV transistor die 414 can optionally be encapsulated on PCB 430, as shown. For example, FIG. 4 shows encapsulant 440*a* and encapsulant 440*b* corresponding respectively to encapsulant 340*a* and encapsulant 340*b* described above. Alternatively, depletion mode III-Nitride transistor die 412 and group IV transistor die 414 may be encapsulated by a common encapsulant. The common encapsulant can also include control IC 102 and/or other components of power conversion circuit 100.

Figure 5:
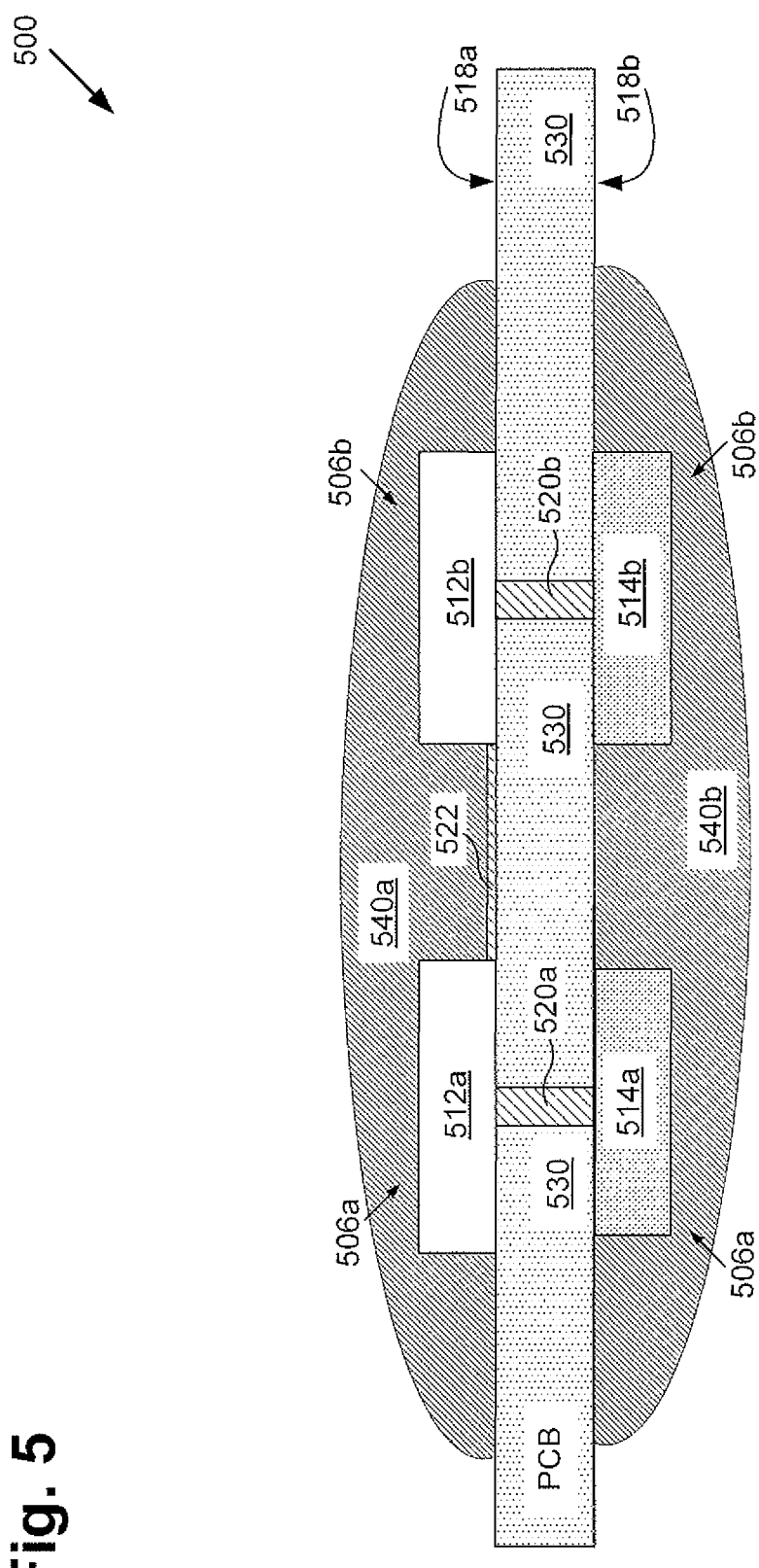
FIG. 5 presents a cross-sectional view of a portion of an exemplary integrated assembly, in accordance with one implementation of the present disclosure.

Referring now to FIG. 5, FIG. 5 presents a cross-sectional view of a portion of an exemplary integrated assembly, in accordance with one implementation of the present disclosure. In FIG. 5, power conversion circuit 100 can be formed in integrated assembly 500, including control IC 102. Integrated assembly 500 includes sides 518*a* and 518*b*, and PCB 530 corresponding to sides 218*a* and 218*b*, and PCB 230 in FIGS. 2A and 2B.

FIG. 5 shows enhancement mode composite devices 506*a* and 506*b* on PCB 530. Enhancement mode composite device 506*a* can correspond to high-side switch 106*a* in FIG. 1A and enhancement mode composite device 506*b* can correspond to low-side switch 106*b* in FIG. 1A. Trace 522 and/or other connection means is electrically connecting enhancement mode composite devices 506*a* and 506*b* thereby forming power switching stage 104 of FIG. 1A. Power switching stage 104 of FIG. 1A includes two power switches (enhancement mode composite devices 506*a* and 506*b*). However, power switching stage 104 generally includes at least one power switch. Each power switch may be configured similar to what has been described herein. In particular, each power switch may include similar components coupled to the same PCB in a similar manner. In doing so, the power switches can form one or more half-bridges. Therefore, power conversion circuit 100 can take various forms, and can be a buck converter, such as a synchronous buck converter, a two-phase power converter, a three-phase power converter, and other types of power conversion circuits that include at least one power switch.

Enhancement mode composite devices 506*a* and 506*b* can be configured similar to the enhancement mode composite devices described above, and therefore are not described in detail. Enhancement mode composite device 506*a* includes depletion mode III-Nitride transistor die 512*a* and group IV transistor die 514*a*. Enhancement mode composite device 506*b* includes depletion mode III-Nitride transistor die 512*b* and group IV transistor die 514*b*. Depletion mode III-Nitride transistor dies 512*a* and 512*b* are optionally encapsulated by a common encapsulant, shown as encapsulant 540*a*. Similarly, group IV transistor dies 514*a* and 514*b* are optionally encapsulated by a common encapsulant, shown as encapsulant 540*b*. Encapsulant 540*a* and encapsulant 540*b* can also encapsulate other components of power conversion circuit 100. Furthermore, any of depletion mode III-Nitride transistor dies 512*a* and 512*b* and group IV transistor dies 514*a* and 514*b* may be separately encapsulated.

The depletion mode III-Nitride transistor dies and group IV transistor dies described herein can be bare dies or either die can be included in a chip-scale package, a flip-chip package, or other chip package. Examples of the chip package include a DirectFET® package, a quad-flat no-leads (QFN) package, and a leadless package. Exemplary chip packages are described in further detail below.

Figure 6A:
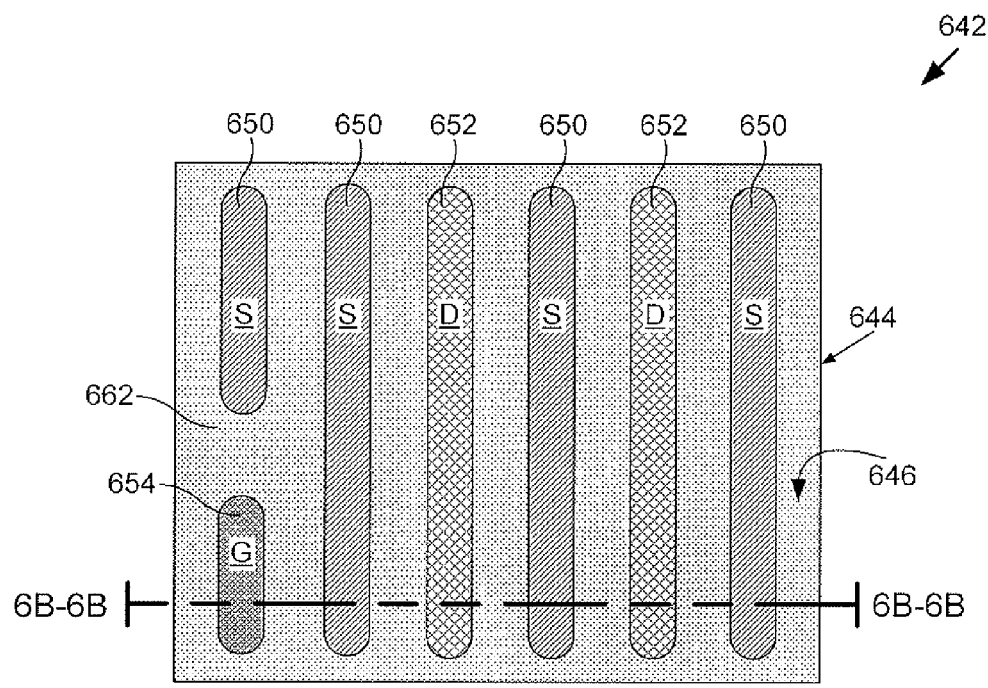
FIG. 6A presents a bottom view of a die in an exemplary chip package, in accordance with one implementation of the present disclosure.
Figure 6B:
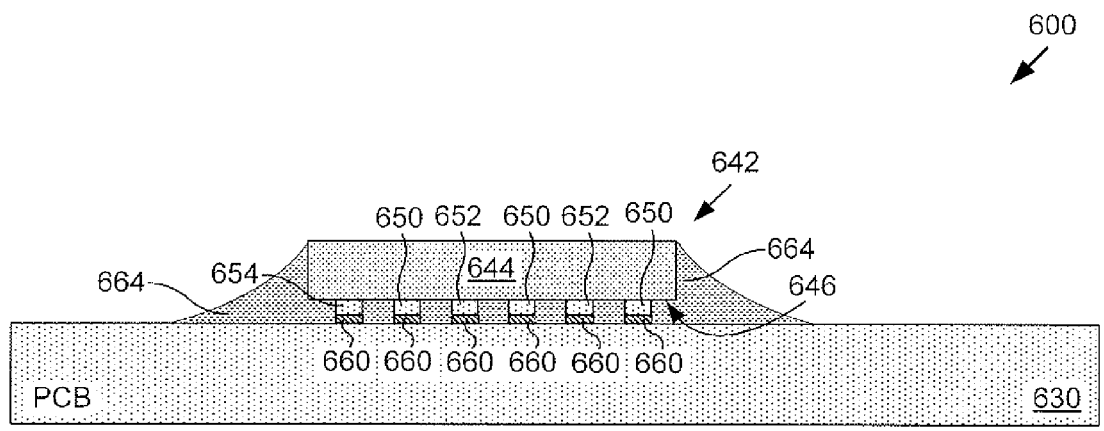
FIG. 6B presents a cross-sectional view of a portion of an exemplary integrated assembly, in accordance with one implementation of the present disclosure.

Referring now to FIGS. 6A and 6B, FIG. 6A presents a bottom view of a die in an exemplary chip package, in accordance with one implementation of the present disclosure. FIG. 6B presents a cross-sectional view of a portion of an exemplary integrated assembly that includes the exemplary chip package, in accordance with one implementation of the present disclosure. The cross-sectional view in FIG. 6B corresponds to the chip package of FIG. 6A along cross-section 6B-6B.

FIG. 6A shows chip package 642 including die 644, which can correspond to any of the depletion mode III-Nitride transistor dies or group IV transistor dies described herein. Thus, FIG. 6B shows integrated assembly 600, which can correspond to any of the various integrated assemblies described herein. All electrodes of chip package 642 may optionally be formed on surface 646 of chip package 642. Chip package 642 includes a plurality of elongated digits configured for external circuit connection through solder bars. More particularly, chip package 642 includes elongated source digits 650 interspersed with elongated drain digits 652. Chip package 642 further includes elongated gate digit 654. Each of elongated source digits 650, elongated drain digits 652, and elongated gate digit 654 are configured for electric circuit connection through respective solder bars 660, as shown in FIGS. 6A and 6B.

In the particular implementation, die 644 includes passivation layer 662 and each of the plurality of elongated digits are solderable contacts exposed through openings in passivation layer 662. The plurality of elongated digits may thereby be soldered to solder bars 660 on PCB 630. Related U.S. patent application entitled "HI-Nitride Power Device Having Solderable Front Metal with Source and Drain Solder Bars" Ser. No. 13/018,780 filed Feb. 1, 2011, issued as U.S. Pat. No. 8,399,912, and assigned to the assignee of the present application shows chip packages, which can be similar to chip package 642. It should be noted that in other implementations, the solderable contacts can have different forms in addition to or instead of the elongated digits shown. Furthermore, any number of contacts can be provided on either side of chip package 642 for electrical connection to any of the various terminals of chip package 642.

FIG. 6B further shows that any of the dies described herein can optionally include underfill situated between the die and the PCB. For example, in integrated assembly 600, underfill 664 is situated between die 644 and PCB 630. Underfill 664 can protect the solderable contacts of chip package 642 from moisture, chemicals, and contaminants. Furthermore, underfill 664 can compensate for thermal mismatch between die 644 and PCB 630 while providing mechanical support and electrical insulation. An example of underfill 664 includes various resins including epoxy resins. In some implementations, chip package 642 is encapsulated, such as has been described with respect to FIGS. 3A, 3B, 3C, 3D, 3E, 3F, and 3G.

Figure 7:
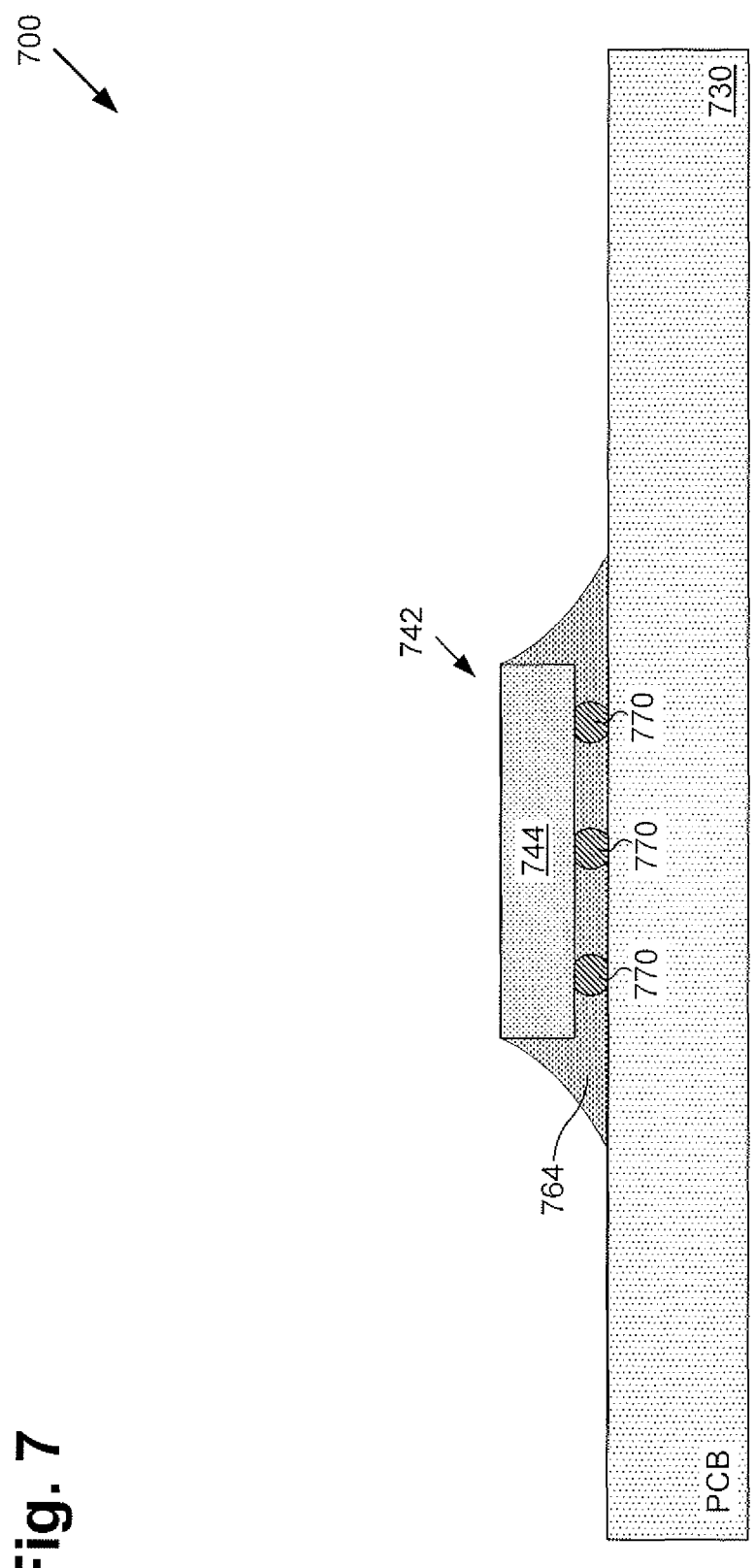
FIG. 7 presents a cross-sectional view of a portion of an exemplary integrated assembly, in accordance with one implementation of the present disclosure.

Referring now to FIG. 7, FIG. 7 presents a cross-sectional view of a portion of an exemplary integrated assembly, in accordance with one implementation of the present disclosure. FIG. 7 shows integrated assembly 700 corresponding to integrated assembly 600 in FIG. 6B. Integrated assembly 700 includes chip package 742, die 744, PCB 730, and underfill 764 corresponding respectively to chip package 642, die 644, PCB 630, and underfill 664 in FIGS. 6A and 6B. An example underfill 664 can include various resins including epoxy resins. In some implementations, chip package 742 is encapsulated, such as has been described with respect to FIGS. 3A, 3B, 3C, 3D, 3E, 3F, and 3G.

As opposed to chip package 642, chip package 742 is configured for flip chip connection to PCB 730 utilizing solder bumps 770 for electrical connection to die 744. Related U.S. patent application entitled "Vertical conduction flip-chip device with bump contacts on single surface" Ser. No. 09/780,080 filed Feb. 9, 2001, issued as U.S. Pat. No. 6,653,740, and assigned to the assignee of the present application, shows packages, which can be similar to chip package 742.

As with chip package 642, any number of contacts of chip package 742 can be provided on either side of chip package 742 for electrical connection to any of the various terminals of chip package 742. Chip packages 642 and 742 are two possible approaches for the depletion mode III-Nitride and group IV transistor dies described above. However, other approaches are possible and may be combined with those approaches.

In some implementations, bondwires may be utilized for connection to one or more contacts on an opposing side of chip packages 642 and 742, similar to what has been shown above. Also in some implementations, one or more conductive clips can be utilized for connection to one or more contacts on the opposing side of chip packages 642 and 742. For example, a conductive clip can be configured to couple a drain provided on the opposing side of the group IV transistor die or the depletion mode III-Nitride transistor die to the printed circuit board. A source and gate may be provided on a side opposite to the opposing side. Related U.S. patent application entitled "Chip scale surface mounted device and process of manufacture" Ser. No. 09/819,774 filed Mar. 28, 2001, issued as U.S. Pat. No. 6,624,522, and assigned to the assignee of the present application, shows chip packages (e.g. DirectFET® packages), which can be similar to the chip package being described.

Thus, as described above with respect to FIGS. 1A, 1B, 2A, 2B, 3A, 3B, 3C, 3D, 3E, 3F, 3G, 4, 5, 6A, 6B, and 7, implementations of the present disclosure provide for an integrated assembly where a depletion mode III-Nitride transistor die and a group IV transistor die are coupled to a printed circuit board and connected together by the printed circuit board. In doing so, implementations of the present disclosure can avoid increased parasitic inductance, resistance, thermal impedance, and cost associated with housing the depletion mode III-Nitride transistor die and the group IV transistor die in a common package. Thus, a circuit, such as a power conversion circuit, may be formed in the integrated assembly while achieving improved performance at a reduced cost.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. An integrated assembly comprising:
a printed circuit board;
a depletion mode III-Nitride transistor die and a group IV transistor die coupled to said printed circuit board;
said depletion mode III-Nitride transistor die situated on one side of said printed circuit board and said group IV transistor die situated on an opposing side of said printed circuit board;
at least one via in said printed circuit board electrically connecting said depletion mode III-Nitride transistor die to said group IV transistor die;
wherein said group IV transistor die is configured to receive a gate drive signal through a trace situated on said one side of said printed circuit board.

2. The integrated assembly of claim 1, wherein said depletion mode III-Nitride transistor die is in cascode with said group IV transistor die.

3. The integrated assembly of claim 1, wherein said depletion mode III-Nitride transistor die is situated over said group IV transistor die.

4. The integrated assembly of claim 1, wherein said group IV transistor die is directly under and not offset from said depletion mode III-Nitride transistor die.

5. The integrated assembly of claim 1, wherein said group IV transistor die is offset from said depletion mode III-Nitride transistor die.

6. The integrated assembly of claim 1, wherein said III-Nitride transistor die comprises a plurality of elongated digits configured for external circuit connection through solder bars.

7. The integrated assembly of claim 1, wherein said group IV transistor die comprises a passivation layer and solderable contacts exposed through openings in said passivation layer.

8. The integrated assembly of claim 1, wherein said III-Nitride transistor die comprises a passivation layer and solderable contacts exposed through openings in said passivation layer.

9. The integrated assembly of claim 1, further comprising a conductive clip coupling a drain of said group IV transistor die to said printed circuit board.

10. The integrated assembly of claim 1, wherein said group IV transistor die and said depletion mode III-Nitride transistor die form an enhancement mode composite device.

11. The integrated assembly of claim 1, wherein said group IV transistor die includes an enhancement mode transistor.

12. The integrated assembly of claim 1, wherein at least one of said group IV transistor die and said III-Nitride transistor die are encapsulated on said printed circuit board.

13. The integrated assembly of claim 1, wherein said III-Nitride transistor die comprises a high-electron-mobility transistor.

14. An integrated assembly comprising:
a printed circuit board;
a power conversion circuit formed on said printed circuit board, said power conversion circuit comprising a depletion mode III-Nitride transistor die and a group IV transistor die coupled to said printed circuit board;
said depletion mode III-Nitride transistor being connected in cascode with said group IV transistor die by said printed circuit board;
wherein said group IV transistor die is configured to receive a gate drive signal through a trace situated on one side of said printed circuit board.

15. The integrated assembly of claim 14, wherein said power conversion circuit further comprises a control IC situated on said one side of said printed circuit board, said control IC providing said gate drive signal.

16. The integrated assembly of claim 14, wherein said depletion mode III-Nitride transistor die is situated on said one side of said printed circuit board and said group IV transistor die is situated on an opposing side of said printed circuit board.

* * * * *